Figure 1:
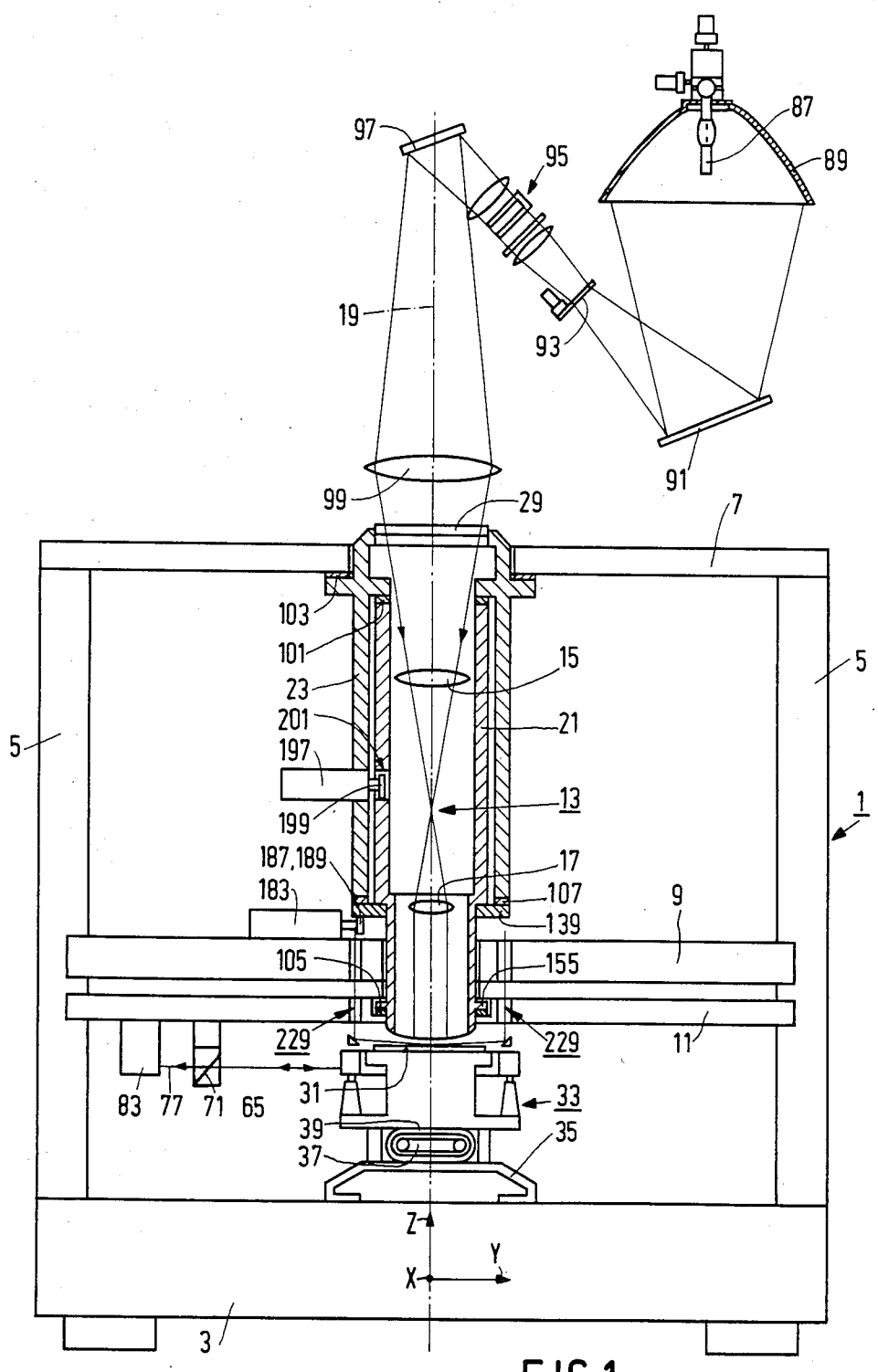

United States Patent [19]

Bouwer et al.

[11] Patent Number: 4,737,823
[45] Date of Patent: Apr. 12, 1988

[54] OPTO-LITHOGRAPHIC DEVICE COMPRISING A DISPLACEABLE LENS SYSTEM AND METHOD OF CONTROLLING THE IMAGING PROPERTIES OF LENS SYSTEM IN SUCH A DEVICE

[75] Inventors: Adrianus G. Bouwer; Guido C. R. M. Van De Looy, both of Eindhoven, Netherlands

[73] Assignee: U.S. Philips Corporation, New York, N.Y.

[21] Appl. No.: 918,752

[22] Filed: Oct. 14, 1986

[30] Foreign Application Priority Data

Jun. 16, 1986 [NL] Netherlands ......................... 8601547

[51] Int. Cl.$^4$ ..................... G03B 27/42; G03B 27/34; G03B 27/40
[52] U.S. Cl. ......................................... 355/53; 355/56
[58] Field of Search ..................... 355/53, 56

[56] References Cited

U.S. PATENT DOCUMENTS

| | | | |
|---|---|---|---|
| 3,563,648 | 2/1971 | Baggaley et al. | 355/53 |
| 3,735,686 | 5/1973 | Brewer et al. | 355/56 |
| 4,140,392 | 2/1979 | Lacombat et al. | 355/56 |
| 4,668,077 | 5/1987 | Tanaka | 355/53 |

FOREIGN PATENT DOCUMENTS 116940 8/1984 European Pat. Off. .............. 355/53

Primary Examiner—Monroe H. Hayes
Attorney, Agent, or Firm—Robert T. Mayer

[57] ABSTRACT

An opto-lithographic device comprising a lens system (13) arranged between a mask support (25) and a substrate table (33) and telecentric on one side, the lens system (13) and the mask support (25) being secured to a first holder (21) and a second holder (23), respectively, which can be displaced both simultaneously and relatively by means of a first actuator (183, 187, 189) and a second actuator (197, 199) for adjustment of focusing and enlargement. The invention provides the possibility of a simple correction of focusing and enlargement when this focusing and this enlargement are varied inter alia due to pressure or temperature variations.

7 Claims, 7 Drawing Sheets

OPTO-LITHOGRAPHIC DEVICE COMPRISING A DISPLACEABLE LENS SYSTEM AND METHOD OF CONTROLLING THE IMAGING PROPERTIES OF LENS SYSTEM IN SUCH A DEVICE

The invention relates to an opto-lithographic device comprising a lens system which is arranged between a mask support and a substrate table and which is telecentric on the side of the substrate, in which device the distance between the lens system and the substrate table is adjustable by means of an actuator cooperating with a circular-cylindrical holder which is coupled to the lens system and is suspended in a fixedly arranged frame by elastically deformable coupling members, the extent of deformation of said coupling members being determined by the force exerted on the holder by means of the actuator.

The invention further relates to a method of controlling the imaging properties of an optical lens system in an opto-lithographic device.

In a known opto-lithographic device of the kind mentioned in the opening paragraph (see "Philips Technical Review" 41, p. 268–278, 1983/84, No. 9), the lens system comprises a fixedly arranged collimator lens and an objective lens displaceable with respect to it along the optical axis of the lens system. The distance between the objective lens and the substrate table is adjustable by means of the actuator, which is provided with an eccentric which is driven by a motor and is in engagement with the circular-cylindrical holder of the lens system. The holder is enclosed by a fixedly arranged sleeve to which the electric motor is secured. The holder is provided with a number of cuts extending in the circumferential direction, as a result of which elastically deformable coupling members integrated in the holder are formed. Such coupling members are located on either side of the area (viewed in the longitudinal direction of the holder) at which the eccentric engages the wall. This means that upon rotation of the eccentric a relative displacement occurs between the fixedly arranged collimator lens and the objective lens with a simultaneous elastic deformation of the coupling members. By variation of the distance between the collimator lens and the objective lens, the focal plane of the lens system is displaced and the image distance is adjusted to the desired value. Since the lens system is telecentric on the side facing the substrate table, with a constant distance between the mask and the lens system there can be focusing without the enlargement being varied. It should be noted that the lens system in the known opto-lithographic device is also telecentric on the side facing the mask support. This affords the advantage that the enlargement is independent of the distance (object distance) between the mask and the lens system so that no enlargement correction is required for, for example, thickness variations and unevennesses in the mask. The enlargement is determined in this case by a distance once adjusted during mounting between elements of the lens system. This distance determined by grinding of engaging faces is not adjustable during operation. It appears from a publication of F. Sporon-Fiedler and J. Williams in "SPIE Proceedings", Vol. 538, No. 11, 1985, p. 86–90, as to "Optical Microlithography IV" that atmosphere pressure variations result on considerable errors in the enlargement. It is suggested to make the distance between mask and lens system adjustable. A practical construction in which pressure variations are corrected in this manner is not described in the article. However, it has been pointed out that care should be paid to prevent the mask support from tilting and/or rotating. Furthermore, a method and a construction are described, by which the enlargement can be corrected by a combined defocusing and subsequent displacement of the light sourc with respect to the lens system. This method can be carried out only with comparatively great difficulty and the extent of the correction is determined by the admissible variation in depth of focus. It has moreover been found that atmospheric pressure variations also render it necessary that the focusing be corrected. In the two known devices no solution is provided for a general correction both of the enlargement and of the focusing. In general, it should be possible to correct the focusing and/or the enlargement for deviations due to ambient influences, such as temperature and atmospheric pressure, and for deviations due to manufacturing and mounting tolerances. The deviations may relate both to the device itself and to the mask and the substrate. For example, it should be possible to correct for deformations resulting from the load connected with the support of mask and substrate. Furthermore, there should be the freedom to use for the various processing steps of the same substrate several opto-lithographic devices or to switch without further expedients to another opto-lithographic device in the case of disturbances or maintenance. In such a case, the imaging properties of the various devices should be accurately tuned to each other. There should further be a possibility of focusing in a surface of the substrate located below the top surface.

The invention has for its object to provide an opto-lithographic device, in which an incidental and/or continuous adjustment or correction both of the enlargement and of the focusing is possible by means of a construction which is rigid against tilting and minimizes relative displacement of mask and lens system in planes at right angles to the optical axis of the lens system.

For this purpose, the invention is characterized in that the device comprises a second circular-cylindrical coaxial holder displaceable with respect to and together with the first circular-cylindrical holder and a fixedly arranged first actuator cooperating with one of the holders and a second actuator secured to one of the holders and co-operating with the other holder, one holder being secured to the other holder by means of a first elastic coupling member and one of the holders being secured to the frame by means of a second elastic coupling member, while the distance between the lens system secured to one of the holders and the substrate table is adjustable with a constant distance between the mask support coupled to the other holder and the lens system by means of the first fixedly arranged actuator by elastic deformation of the second elastic coupling member and the distance between the lens system and the mask support is adjustable with a constant distance between the substrate table and the lens system by means of the second actuator by elastic deformation of the first coupling member. Due to the fact that both the distance between the substrate table and the lens system and the distance between the mask support and the lens system are adjustable in a simple periodical or continuous manner, whilst the variation of the first-mentioned distance does not lead to a simultaneous variation of the last-mentioned distance, and conversely, an opto-lithographic device is obtained having a high flexibility in compensation of influences causing imaging errors, such as atmospheric pressure variations, manufacturing tolerances, mounting tolerances and temperature variations.

A particular embodiment of the opto-lithographic device which is relatively rigid against tilting and dynamically stable, is further characterized in that the lens system is coupled to the first holder, which is surrounded at least in part by the second holder and is secured by means of a third elastic coupling member to the frame, while the second holder is secured by means of a fourth elastic coupling member to the first holder.

A further embodiment of the opto-lithographic device with elastically deformable coupling members that can be manufactured in a comparatively simple and inexpensive manner, is characterized in that the elastic coupling members are constituted by elastically deformable metal rings provided with an even number of pairs of elastic pivots between which are situated comparatively long sections of the ring, while comparatively short sections of the ring are situated between the elastic pivots of a pair, whereby the comparatively short sections of the first coupling member are secured alternately to the first holder and the second holder and the comparatively short sections of the second coupling member are secured alternately to the frame and to one of the holders.

A still further embodiment of the opto-lithographic device, in which with unilaterally driven holders a very high resistance is nevertheless offered against relative tilting of the holders, is characterized in that at least one pre-stressed first compensation spring is arranged between the holders, while at least one prestressed second compensation spring is arranged between the frame and one of the holders.

A still further embodiment of the opto-lith ographic device comprising simply constructed clearance-and hysteresis-free actuators is characterized in that the first and the second actuator are constituted by a first and a second eccentric which are in engagement with one and the other holder, respectively, and are driven by a first and a second direct current motor, the first motor being secured to the frame, while the second motor is secured to one of the holders.

A further embodiment of the opto-lithographic device which is particularly suitable for automatic control by a processor is characterized in that the device is provided with servo control means comprising a first and a second control loop, while in the first control loop an optical focusing detector secured to the holder with the lens system supplies a first control signal to a focusing motor coupled to the first actuator and in the second control loop an optical enlargement detector supplies a second control signal to an enlargement motor coupled to the second actuator.

The invention has further for its object to provide a method of controlling the imaging properties of an optical lens system in an opto-lithographic device. in which arbitrary corrections with respect to the focusing and enlargement, respectively, of the lens system can be carried out manually, semi-automatically or fully automatically.

A method according to the invention is for this purpose characterized in that in a first control loop of a servo control means a first control signal determined by a focusing detector is supplied to a focus motor, which is coupled to a first actuator, by which the desired distance between the lens system and a substrate is adjusted, while in a second control loop of the servo control means a second control signal determined by an enlargement detector is supplied to an enlargement motor which is coupled to a second actuator, which adjust the desired distance between the mask and the lens system.

A further embodiment of a method according to the invention, which provides a simple correction possibility for deviations from the focusing and the enlargement of the lens system caused by varying atmospheric pressure, is characterized in that the distance between the lens system and the substrate on which the mask is imaged is measured by means of the optical focus detector, while the first control signal supplied by the focus detector is correlated to the desired distance between the lens system and the substrate and to the atmospheric pressure, after which the desired distance between the lens system and the substrate is adjusted by supplying a first control signal to the focus motor of the first actuator, after which, whilst the first control loop remains activated, the second control loop is activated and the second control signal determined by the enlargement detector and correlated to the atmospheric pressure is supplied to the enlargement motor of the second actuator for adjusting the desired enlargement, which second control signal is replaced after adjustment of the desired enlargement by a third control signal obtained by means of a relative position sensor and calibrated by the second control signal, after which the activation both of the first and of the second control loop is maintained during a number of successive exposures of the substrate.

Figure 2:
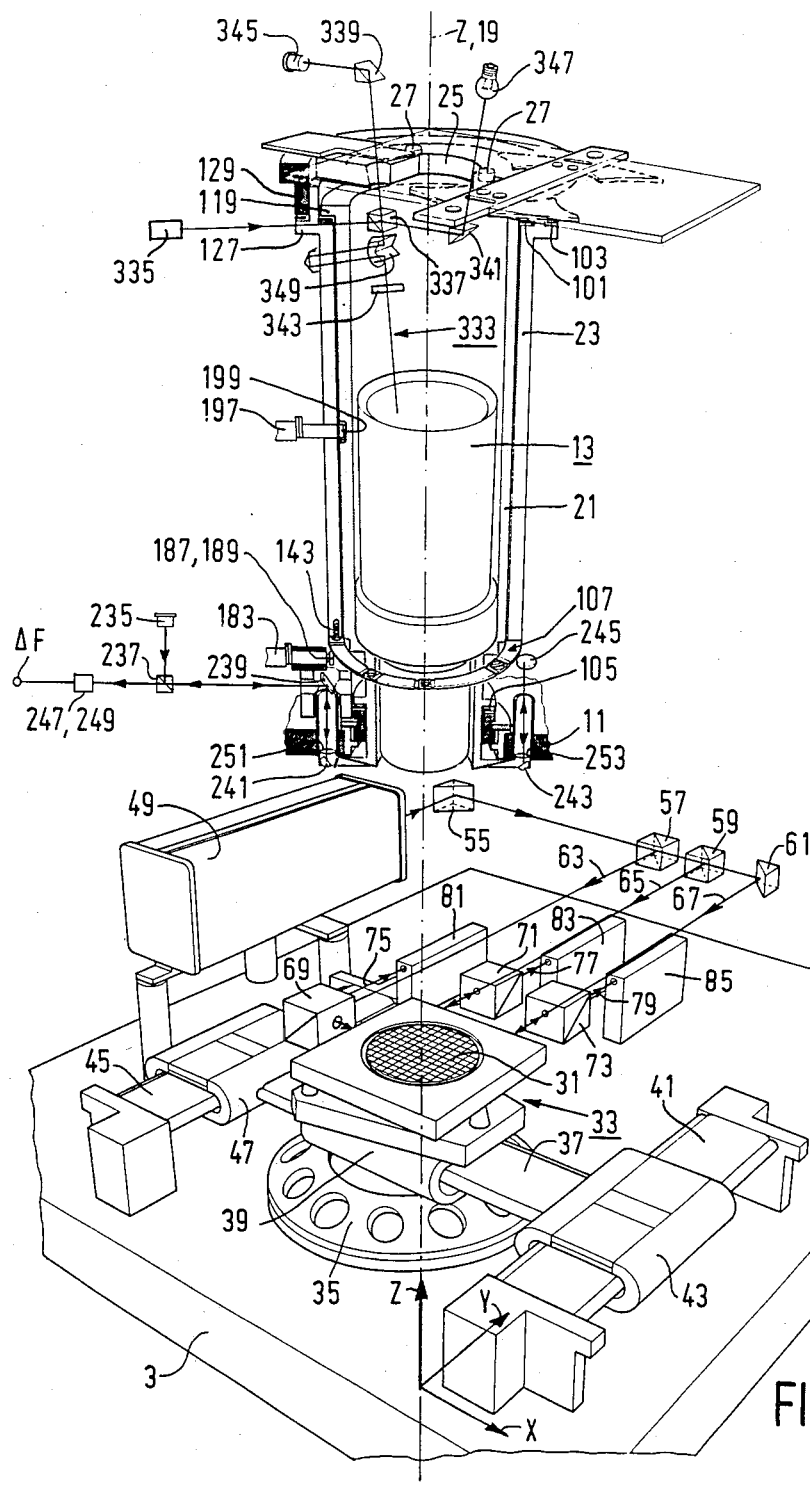
Figure 3:
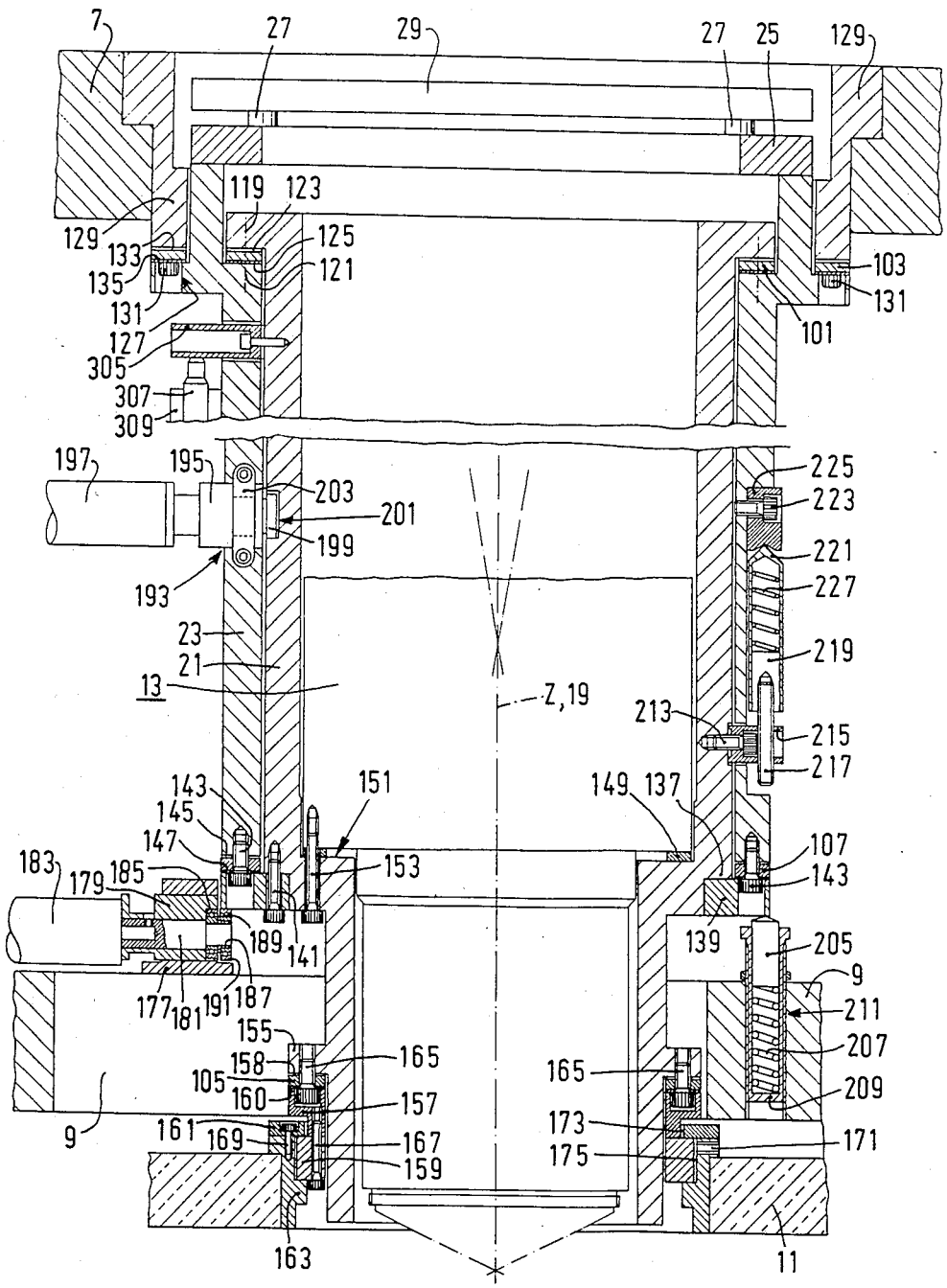
Figure 4:
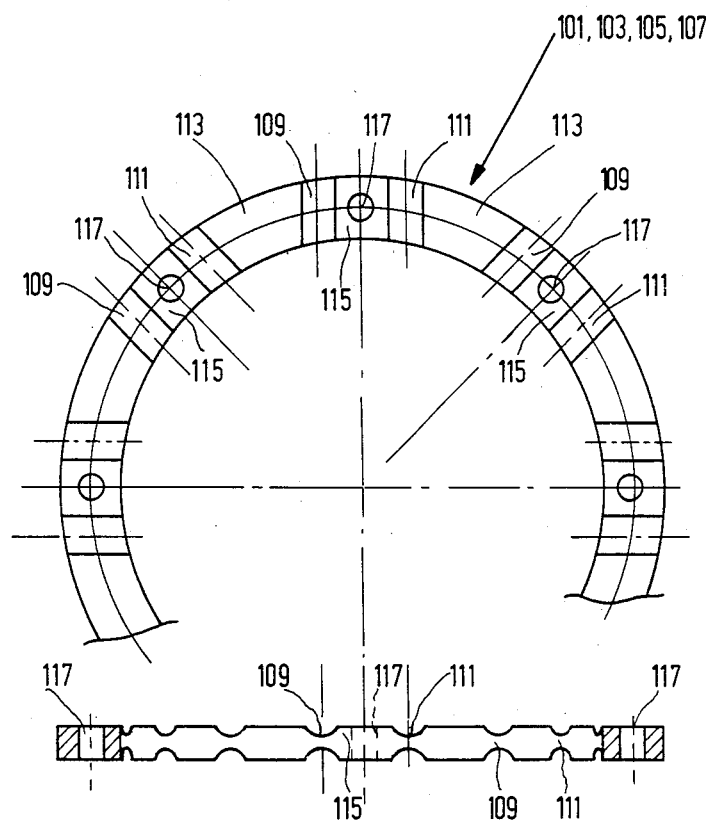
Figure 5:
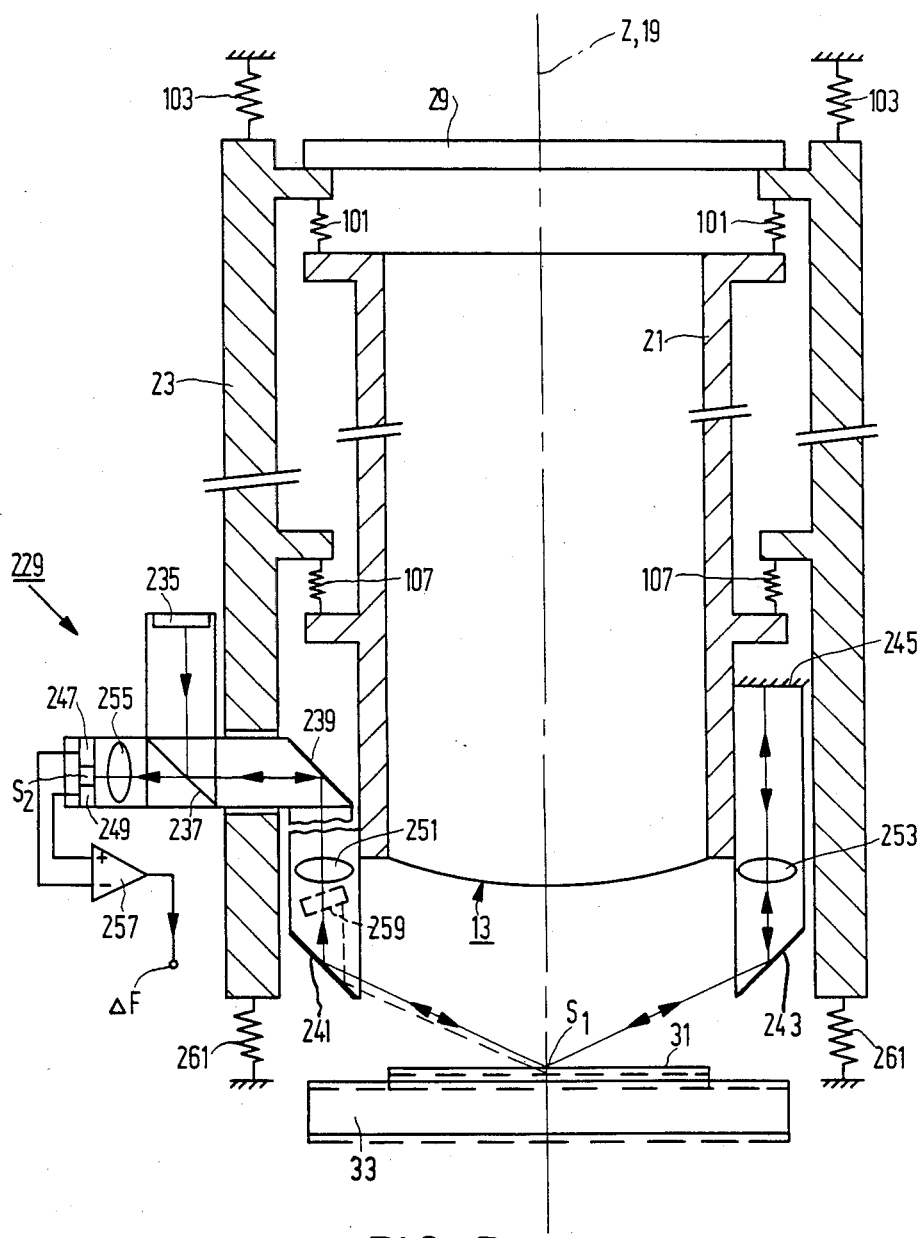
Figure 6:
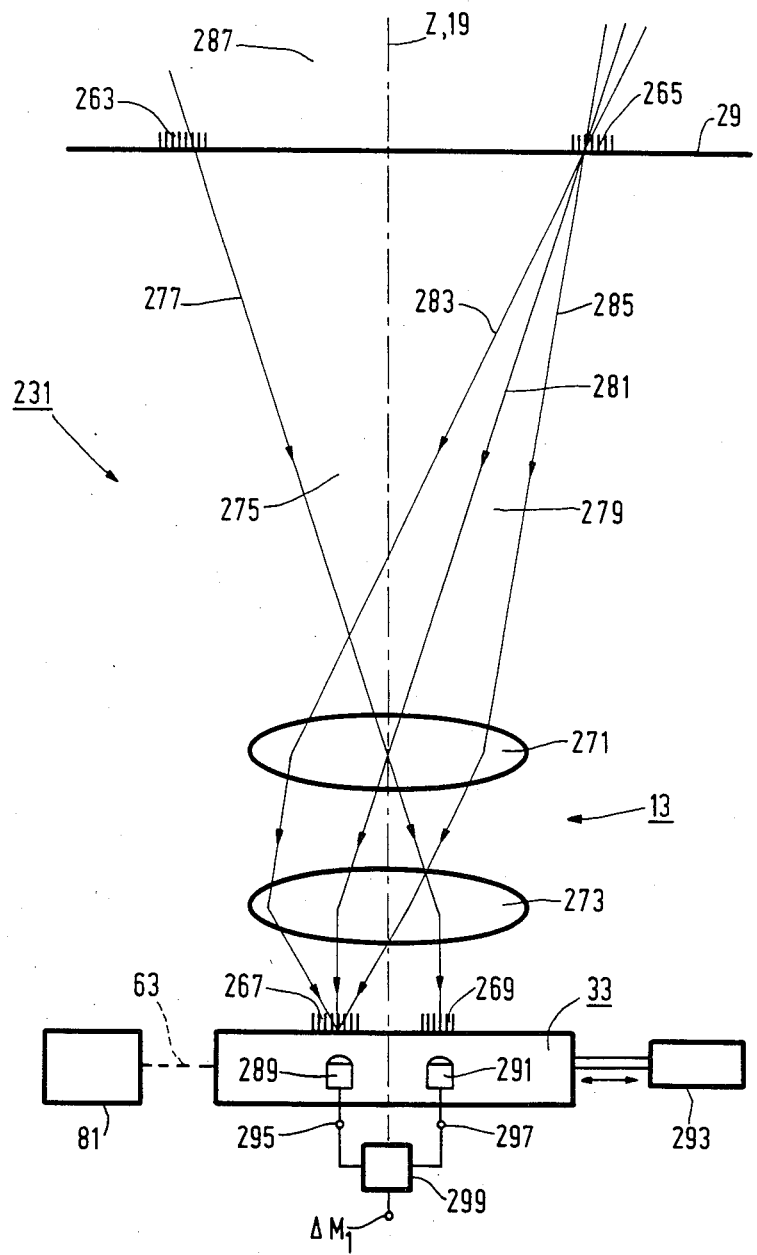
Figure 7:
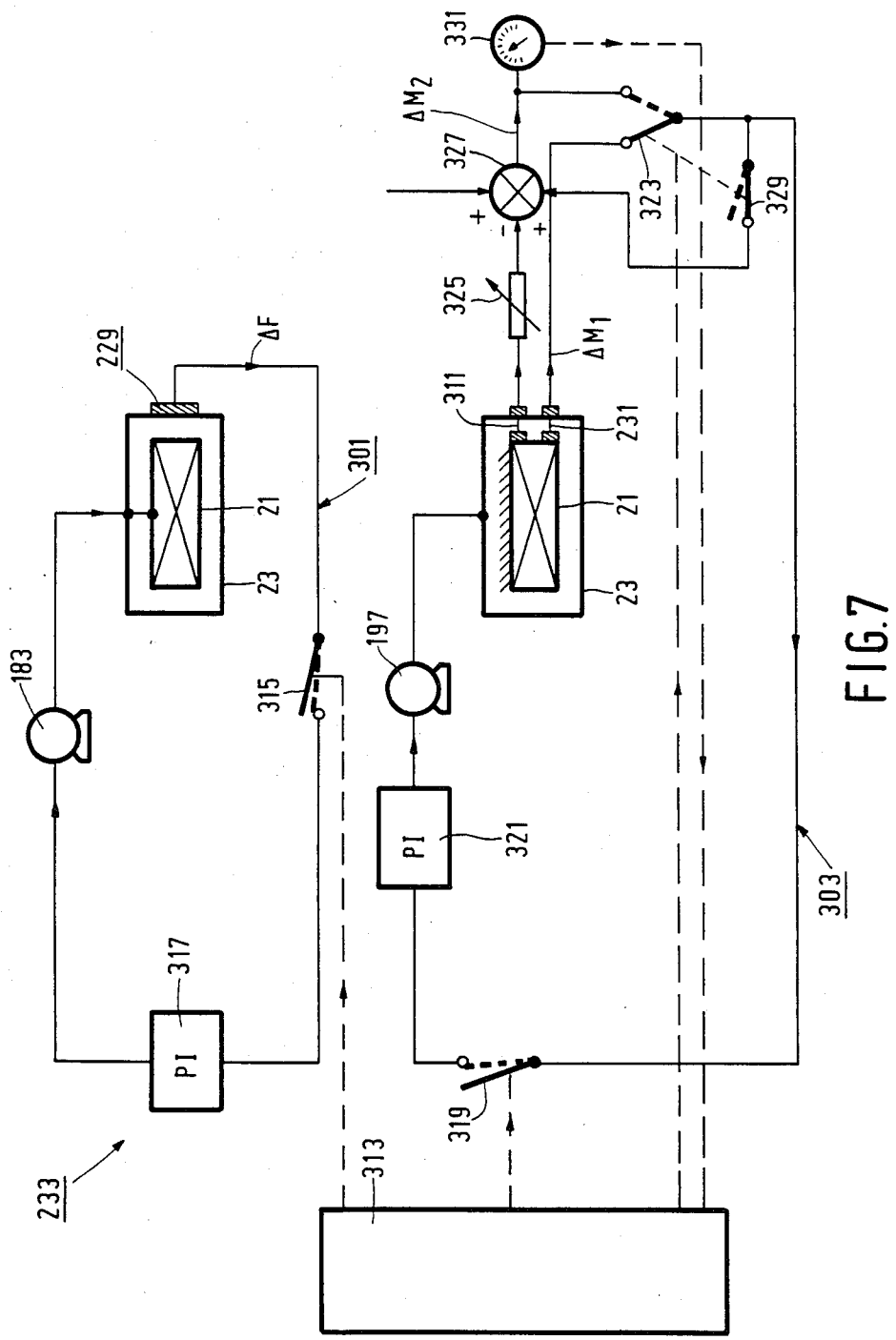

The invention will be described more fully with reference to the drawing, in which:

FIG. 1 shows diagrammatically an opto-lithographic device according to the invention, FIG. 2 is a perspective view of a part of the device shown in FIG. 1, FIG. 3 is a sectional view of the means for securing the first and the second holder as used in the device shown in FIGS. 1 and 2, FIG. 4 shows in elevation and in diametrical sectional view an elastic coupling member, FIG. 5 shows an optical focus detector as used in the device shown in FIGS. 1 and 2, FIG. 6 shows an optical enlargement detector as used in the device shown in FIGS. 1 and 2, FIG. 7 shows a circuit diagram of servo control means as used in the device shown in FIGS. 1 and 2.

The opto-lithographic device shown in FIG. 1 (a so-called "wafer stepper") comprises a fixedly arranged frame 1, in which a rectangular granite plate 3 is situated, which serves as a support for four vertical columns 5 secured thereto. The columns 5, of which only two are shown in FIG. 1, are arranged near the edges of the plate 3 in a rectangular pattern. Three plates 7, 9 and 11 further form part of the frame 1 and these plates are secured to the columns 5. The metal plate 7, the metal plate 9 and the glass plate 11 extend in horizontal planes and are parallel to the granite plate 3. The opto-lithographic device includes an optical lens system 13 comprising a number of lens elements, such as the elements 15 and 17, of which an optical axis 19 coincides with a Z axis of an orthogonal system of axes X, Y, Z shown in FIG. 1. The lens system 13 is secured in a first circular-cylindrical metal (lens) holder 21 surrounded partly by a coaxial second circular-cylindrical metal (mask) holder 23. The centre lines of the lens holder 21 and of the mask holder 23 coincide with the optical axis 19 and the Z axis. On the mask holder 23 is disposed a support 25 shown further in FIG. 2 with engagement pads 27 for a mask 29 (FIG. 3), of which the pattern has to be imaged by the lens system 13 on a reduced scale (10:1) on a semiconductor substrate 31 disposed on a table 33. The table 33 is guided by means of an aerostatically supported foot 35 over the granite plate 3 and can be displaced paralel to the X axis and/or Y axis and can be rotated about an axis parallel to the Z axis. This table 33 displaceable by means of three linear electric motors (cf. FIG. 2) is known and described by R.H. Munnig Schmidt and A. G. Bouwar in the magazine "De Constructeur" of October 1983, No. 10. As shown in FIG. 2, the drive of the table 33 comprises a linear motor having an X-stator 37 and an X-translator 39 secured to the table 33 for the translation parallel to the X-axis and two linear motors for the translation parallel to the Y-axis and the rotation about an axis parallel to the Z-axis, respectively. Of the two last-mentioned motors, one has a $Y_1$-stator 41 and a $Y_1$- translator 43, while the other has a $Y_2$-translator 45 and a $Y_2$-translator 47. The table 33 can perform very accurate continuous, stepwise or oscillating movements due to a measuring system on the basis of laser interferometry known in principle from U.S. Pat. No. 4,251,160. A laser beam 53 originating, for example, from a helium neon laser 49 is passed by a prism 55 to two semi-transparent prisms 57, 59 and a prism 61 so that three subbeams 63, 65, 67 are formed. The subbeams 63, 65 and 67 reflected on reflecting side edges of the table 33 are joined in interferometers 69, 71 and 73 with reference beams (not visible) to form interference beams 75, 77 and 79, of which the intensity is measured by photo-cells in receivers 81, 83 and 85. The substrate 31 is exposed in a number of different positions of the table 33 with respect to the lens system 13 by means of a light source 87 (FIG. 1), of which the light is reflected by a parabolic mirror 89. The light is passed to the mask 29 by a mirror 91, a shutter 93, a diaphragm 95, a mirror 97 and a condenser lens 99. By means of a particular coupling to be described more fully hereinafter with reference to FIGS. 1, 2, 3 and 4 of the lens holder 21 and the mask holder 23 to each other and to the frame 1, respectively, the distance between the lens system 13 and the substrate 31 can be adjusted for the focusing and the distance between the mask 29 and the lens system 13 can be adjusted for the enlargement.

As appears from FIGS. 1, 2 and 3, the lens holder 21 (first holder) is coupled to the mask holder 23 (second holder) by means of a first elastic coupling member 101 in the form of an elastically deformable metal ring, while the mask holder 23 is coupled by means of a second elastic coupling member 103 in the form of an elastically-deformable metal ring to the frame 1 by means of the plate 7. The lens holder 21 is further secured by means of a third elastic coupling member 105 to the frame 1 by the glass plate 11, while the mask holder 23 is secured by means of a fourth elastic coupling member 107 to the lens holder 21. The third and fourth coupling members 105 and 107, respectively, are also in the form of an elastically deformable ring. The rings 101, 103, 105 and 107 are in principle identical and of the kind shown in FIG. 4, although their dimensions are different. As is shown in FIG. 4, each ring 101, 103, 105 and 107 has an even number of pairs of elastic segments of reduced thickness called pivots 109 and 111 with comparatively long sections 113 between the pairs and comparatively short sections 115 between the two pivots 109 and 111 of each pair. Each short section 115 is provided with a threaded hole 117. As appears from FIG. 3, the lens holder 21 has an annular flange 119, which is arranged opposite to an annular shoulder 121 of the mask holder 23. The short sections 115 of the ring 101 are secured by means of bolts (not shown in FIG. 3) alternately to the flange 119 of the lens holder 21 and to the shoulder 121 of the mask holder 23. Spacer plates 123 and 125 are clamped between the short sections 115 and the flange 119 and the shoulder 121, respectively, and these spacer plates ensure that the long sections 113 are arranged so as to be free from the flange 119 and the shoulder 121. The mask holder 23 further has an annular flange 127, which is arranged opposite to a ring 129 secured in the plate 7. The short sections 115 of the ring 103 are secured by means of bolts 131 alternately to the flange 127 and to the ring 129. Spacer plates 133 and 135 are clamped between the short sections 115 of the ring 103 and the flange 127 and the ring 129, respectively, and these spacer plates ensure that the long sections 113 are arranged so as to be free from the flange 127 and the ring 129. The lens holder 21 has an annular shoulder 137, against which is screwed a rigid flat ring 139 by means of bolts 141 (in FIG. 3 only one bolt 141 is shown). The ring 139 extends below the mask holder 23 and serves to secure the ring 107 to the lens holder 21 by means of bolts 143 which are passed through the holes 117 of the short sections 115 of the ring 107 and are secured alternately to the mask holder 23 and the ring 139. Spacer plates 145 and 147 are clamped between the short sections of the ring 107 and the mask holder 23 and the ring 139, respectively, and these spacer plates ensure that the long sections 113 of the ring 107 are arranged so as to be free from the mask holder 23 and the ring 139. The lens system 13 is supported on a flat ring 149, which is disposed on a shoulder 151 of the lens holder 21. The ring 149 and the lens system 13 are secured in the lens holder 21 by means of bolts 153. The lens holder 21 is further provided with an annular flange 155, which serves to secure the ring 105 to the lens holder. Below the ring 105, four rings 157, 159, 161 and 163 are disposed. By means of bolts 165, which are passed through the holes 117 of the short sections 115 of the ring 105, the ring is secured alternately to the flange 155 and to the ring 157. Spacer plates 158 and 160 are clamped between the short sections 115 of the ring 105 and the flange 155 and the ring 157, respectively, and these spacer plates ensure that the long sections 113 of the ring 105 are arranged so as to be free from the flange 155 and the ring 157. The ring 157 is secured by means of bolts 167 to the ring 159, while the ring 161 is secured by means of bolts 169 to the ring 163 mounted in the glass plate 11. The rings 161 and 163 together constitute a U-shaped chamber in which the ring 159 is enclosed. The ring 163 is provided with a threaded hole 171 for an adjustment bolt by means of which the radial position of the lens holder 21 with respect to the glass plate 11 can be adjusted. For this purpose, a radial clearance 173 and a radial clearance 175 are provided between the rings 157, 161 and the rings 159, 163, respectively. After the lens holder 21 has been correctly adjusted, (this step will be described hereinafter), the ring 159 is clamped in a manner not shown further for the sake of simplicity between the rings 161 and 163, while the ring 159 is relieved in radial direction by turning the adjustment bolt backwards in the threaded hole 171. Thus, the roundness of the ring 159 is guaranteed.

On the metal plate 9 is mounted a socle 177, in which a bearing bush 179 is provided for a driving shaft 181 which is coupled to the outgoing shaft of a direct current motor 183, which will be designated hereinafter as focus motor 183. The driving shaft 181 is rotatably journalled in the bearing bush 179 by means of a ball bearing 185. The end of the driving shaft 181 has secured to it an eccentric sleeve 187, on which a ball bearing 189 is mounted, of which an outer race 191 engages the ring 139 arranged above it and secured to the lens holder 21 and to the ring 107. The centre line of the bush 179 lies eccentrically with respect to the centre line of the driving shaft 181. Thus, a coarse adjustment of the holders 21 and 23 is obtained that can be carried out manually. The focus motor 183, the driving shaft 181, the eccentric sleeve 187 and the ball bearing 189 together constitute the said fixedly arranged first actuator for focusing the lens system 13. The wall of the mask holder 23 is provided with a circular hole 193, in which a rotatable bearing bush 195 is mounted. The said bearing bush 195 has secured to it the housing of a direct current motor 197, whose driving shaft is rotatably journalled in the bearing bush 195. An eccentric 199 engaging the lower edge of a hole 201 in the wall of the lens holder 21 is secured on the driving shaft of the motor 197, which will be designated hereinafter as the enlargement motor 197. The bearing bush 195 can be clamped in the hole 193 by means of a bracket 203. The centre line of the circular eccentric 199 has shifted parallel with respect to the centre line of the driving shaft of the enlargement motor 197, while the centre line of the bearing bush 195 has shifted parallel with respect to the centre line of the circular-cylindrical bearing bush 195 rotatable in the hole 193. Thus, the possibility is provided of obtaining first a coarse and then a fine adjustment of the relative axial position (parallel to the Z-axis) of the lens holder 21 and the mask holder 23, as will appear more clearly from the following description. The enlargement motor 197 with its driving shaft, the bearing bush 195 and the eccentric 199 together constitute the said displaceable second actuator for adjusting the enlargement of the lens system 13.

The overall weight of the mask holder 23, the lens holder 21 and all the parts secured to it and displaceable parallel to the Z-axis acts, viewed in the circumferential direction, is supported in three points, which are located substantially on a circle at right angles to the Z-axis, distributed over sections of 120°. The sectional view of the pin 205 in FIG. 3 is rotated through 60° for the sake of simplicity. One of the said three points is the contact point between the ball bearing 189 and the ring 139, while the remaining two points are constituted by two pins engaging the lower side of the ring 139. Only one pin 205 of these two pins is shown in FIG. 3. The pin 205 is pressed against the ring 139 by a pre-stressed helical spring 207 (second compensation spring), which is arranged in a holder 209. The hold der 209 is threaded and can be adjusted by means of a threaded sleeve 211, which is secured in the metal plate 9. The wall of the lens holder 21 is provided by means of a bolt 213 with a supporting sleeve 215 for a pin 217, which is screwed on the upper side into a circular-cylindrical support 219 and on the lower side into the supporting sleeve 215. The pin 221 is pressed against a sleeve 225 secured by a bolt 223 to the wall of the mask holder 23 by a pre-stressed helical spring 227 (first compensation spring). viewed in the circumferential direction, two pins 221 are present, which are located together with the contact point of the eccentric 199 with the lens holder 21 substantially on a circle at right angles to the Z-axis, distributed over sections of 120°. The sectional view of the pin 221 in FIG. 3 is rotated through 60° for the sake of simplicity. Because the rings 101, 103, 105 and 107 are clamped by means of spacer plates at the area of the short sections 115, the long sections 113 are arranged so as to be free and can consequently be subjected to a comparatively small elastic deformation in two directions by bending forces and torsional forces. The largest contribution to the elastic deformation is provided by the bending forces. The elastic deformation of the rings 101, 103, 105 and 107 is obtained as follows (cf. more particularly FIGS. 2 and 3).

If with a stationary eccentric 199 the eccentric sleeve 187 is rotated by energization of the focus motor 183 and as a result the ball-bearing 189 is moved up and down in vertical direction, the rings 103 and 105 are elastically deformed, while the rings 101 and 107 are not deformed. It should be noted that the elastic deformation due to the eccentric sleeve 187 is meant here and not the static deformation to which the rings 101 and 107 have been subjected by the weight of the mask holder 23, the lens holder 21 and the parts displaceable simultaneously therewith. The manner in which the eccentric 199 is stopped, will be explained more fully hereinafter with reference to FIG. 7. Due to the vertical displacement of the ball bearing 189, the holders 21 and 23 are displaced together parallel to the fixed Z-axis so that an increase or a decrease of the distance between the lens system 13 and the substrate 31 is obtained. Consequently, the displacement described can be used for focusing the lens system 13 because the image distance can be controlled by a simultaneous displacement of both holders. The object distance between the mask 29 and the lens system 13 then consequently remains unchanged. During focusing, the enlargement remains unchanged because the lens system 13 is telecentric on the side of the substrate. It should be noted that a lens system is telecentric on a given side (in the present case therefore the picture side) if the ray (main ray) of the light beam passing through the centre of the so-called pupil is always at right angles to the image plane or object plane corresponding to that side. The lens system 13 in the opto-lithographic device according to the invention is intentionally constructed so as not to be telecentric on the object side in order that the enlargement can be controlled in a simple and practical manner. It will be described more fully hereinafter, what influences make such a control of the enlargement desirable.

If with a stationary eccentric sleeve 187 the eccentric 199 is rotated by energization of the enlargement motor 197 and as a result with a stationary lens holder 21 the mask holder 23 is moved up and down in vertical direction, the rings 101, 103 and 107 are elastically deformed, while the ring 105 is not deformed. Also in this case, the dynamic elastic deformation due to solely the rotation of the eccentric is meant and not the static deformation to which the rings 101, 103 and 107 have been subjected by the weight of the mask holder 23 and the parts connected thereto and displaceable with suspect to the lens holder 21. The manner in which the eccentric sleeve 187 is stopped, will be described more fully hereinafter with reference to FIG. 7. Due to the relative vertical displacement of the mask holder 23 with respect to the lens holder 21, the distance between the lens system 13 and the mask 29 is increased or decreased. The displacement described is utilized for controlling the object distance with a constant image distance so that the enlargement of the lens system can thus be controlled or adjusted.

It should be noted that the pins 205 and 221, which are pressed by the pre-stress of the compensation springs 207 and 227 against the ring 139 and the sleeve 225, respectively, fulfil a double function. The pins 205 and 221 ensure that the mechanical load of the two holders, the elastic coupling members and the frame is distributed as uniformly as possible, viewed in the circumferential direction of the holders. The presence of the pins 205 and 221 insures that the ball bearing 189 and the eccentric 199 are not loaded too heavily. The pin 205 and the ball bearing 189 carry the weight of the two holders 21, 23 and the parts connected thereto and displaceable simultaneously. The pin 205 prevents the holders 21, 23 from being tilted due to the unilateral force exerted on the ring 139 by the ball bearing 189. If the pre-stress of the compensation spring 207 is defined as the spring tension associated with the so-called central position of the ball bearing 189, the compensation springs are loaded during focusing by the pre-tension force plus or minus a third of the force required to displace the two holders 21, 23 during focusing. In an analogous manner, the pin 221 and the compensation spring 227, respectively, and the eccentric 199 are loaded during adjustment of the enlargement by the pre-tension force plus or minus a third of the force required to displace the mask holder 23 with respect to the stationary lens holder 21. The pin 221 prevents the mask holder 23 from being tilted during adjustment of the enlargement by the unilateral engagement of the eccentric 199. The pins 205 and 221 also prevent the holders 21, 23 from being tilted in the static position, that is to say when no focusing or enlargement movements take place.

The focusing and the adjustment of the enlargement are effected by means of sensors, namely, a focus detector 229 shown in FIG. 5 and an enlargement detector 231 shown in FIG. 6. The focus detector 229 and the enlargement detector 231 are optical detectors supplying a focus error signal and an enlargement error signal, respectively, in a servo control system 233, which is shown in FIG. 7. The focus detector 229 described in principle in U.S. Pat. No. 4,356,392, of which a particular embodiment with optical zero point adjustment is suggested and described in Netherlands patent application No. 8600253, comprises a radiation source 235, such as, for example, a diode laser, a polarization splitting cube 237, a number of prisms 239, 241, 243, a mirror 245 and two radiation-sensitive detectors 247 and 249. A lens 251 produces a radiation spot $S_1$ on the substrate 31, while a lens 253 images together with a lens 255 the radiation spot $S_1$ as a radiation spot $S_2$ on the detectors 247 and 249. The mirror 245 lies in the focal plane of the lens 253. The mirror 245 and the lens 253 together constitute a so-called retro-reflector, by which a light beam arriving at the mirror 245 is reflected in itself and is focused as a mirror image in the radiation spot $S_1$ so that a symmetrical radiation spot is obtained. Local reflection differences of the substrate 31 consequently will not influence the intensity distribution within the radiation spot $S_2$ formed on the detectors 247 and 249. The parts of the focus detector 229 denoted by reference numerals 235, 237, 239, 247, 249 255 and 257 are fixedly arranged, while the parts of the focus dectector 229 denoted by reference numerals 241, 243, 245, 251, 253 and 259 are connected to the lens holder 21. With a variation of the distance between the lens system 13 and the substrate 31 due to, for example, thickness differences of the substrate 31, the radiation spot $S_2$ is displaced with respect to the detectors 247 and 249 so that one detector receives a smaller or larger radiation intensity than the other detector. The detectors 247 and 249 thus produce signals of different value. The output signal of a differential amplifier 257 connected to the detectors 247 and 249 forms a focus error signal $\Delta F$ which is used in the servo-control system 233. (cf. FIG. 7). If atmospheric pressure variations are found to exert too large an influence on the focusing, this can be corrected by means of a rotatable plane-parallel glass plate 259, by which the optical path length is adjustable. Since the focus detector 229 does not detect a variation of the focusing due to a variation of the barometer pressure, a point adjustment or a so-called "off-set" and a correction of the focus error signal $\Delta F$ can be obtained by means of an adaptation of the optical path length with the aid of the rotatable plate 259. The plate 259 may be adjusted both by hand and by a motor. By means of, for example, a table or a graph in which the influence of the atmospheric pressure on the focusing is determined by means of measurements, the extent of the manual rotation of the plate 259 can be determined. Since barometer variations are generally comparatively slow variations, for example a period of one day or a few days may be chosen between successive corrections. Corrections may also be carried out continuously and automatically by using the measurement signal of a barometer in a separate servo system in which a motor drive for the plate 259 is included. Such a continuous focus correction as such does not influence the enlargement because the lens system 13 is telecentric on the substrate side. The manual adjustment of the plate 259 may be used for experimental images on a test substrate and for focusing on a plane which does not coincide with the top surface of the substrate 31 but is located in the substrate 31.

It should be noted that positioning of the elastic coupling members in the opto-lithographic device shown diagrammatically in FIG. 5 differs from that of the device shown in FIGS. 1, 2 and 3. The elastic coupling member 105 (ring 105) in the last-mentioned figures is replaced by an elastic coupling member 261 (third coupling member) in the form of a spring 261 between the mask holder 23 and the fixedly arranged frame not shown. Such an embodiment is an alternative to the construction shown in FIGS. 1, 2 and 3 and also lies within the scope of the invention. The characteristic difference is that the mask holder 23 is directly connected at two points (instead of at one point) by elastic coupling members to the frame, while the lens holder 21 is not at all connected by elastic coupling members directly to the frame, but is connected at two points to the mask holder 23.

The enlargement detector 231 already suggested and described in Netherlands patent application No. 8601278 which is the priority application for U.S. patent application Ser. No. 918,758 filed on Oct. 14, 1986 which is assigned to the assignee of this application is constituted by a system, in which a test mask or circuit mask 29 is provided with two amplitude rasters 263, 265, which are imaged on two corresponding amplitude rasters 267, 269 in the table 33. The lens system 13 indicated diagrammatically in FIG. 6 by two lenses 271, 273 images the raster 263 on the raster 269 and images the raster 265 on the raster 267. Of a light beam 275 imaging the raster 263 on the raster 269 only a main ray 277 is indicated, while of a light beam 279 imaging the raster 265 on the raster 267, besides a main ray 281 also edge rays 283 and 285 are shown. The beams 275 and 279 may form part of a single wider light beam 287, which is preferably the same beam by which later the circuit masks 29 are imaged on the substrate 31. Small deviations in the raster images then cannot be obtained due to a difference in wavelength because the lens system 13 is corrected for aberrations at the wavelength used for the later repeated exposures. Radiation detectors 289 and 291 are arranged in the light path of each of the light beams 279 and 277, respectively, passing through the rasters 267 and 269, respectively. The detectors 289 and 291 are situated in the table 33. In the case in which the rasters 263 and 265 are imaged with the correct enlargement on the rasters 269 and 267, the frequencies of the corresponding raster images are equal to the frequencies of the rasters 269 and 267. The quantity of radiation received by the detectors 289 and 291 from the rasters 265, 267 and 263, 269, respectively, then accurately aligned with respect to each other is equal. With an enlargement error, the imaged raster 263 and the raster 269 and the imaged raster 265 and the raster 267 do not fit to each other and a Moir pattern is obtained, whose period is a measure for the enlargement error. In order that this enlargement error can be converted into an enlargement signal, the mask rasters 263, 265 and the table rasters 267, 269 are periodically displaced with respect to each other parallel to the X-axis by means of a drive 293, which is coupled to the table 33. The drive 293 may be constituted by the linear electric motor having the X-stator 37 and the X-translator 39 already present in the opto-lithographic device (cf. FIG. 2). The interferometer system (63, 81) already described may be used for controlling the periodical displacement of the table 33 on behalf of the measurement of the enlargement. Due to the periodical movement of the mask rasters with respect to the table rasters, a phase difference occurs between the substantially sinusoidal output signals 295 and 297 of the detectors 289 and 291 in the case of an enlargement error (and hence a Moir pattern with a finite period). The signals 295 and 297 are supplied to a phase comparator 299, which supplies an enlargement error signal $\Delta M_1$, which is used in the servo control system 233 shown in FIG. 7. Since the enlargement detector 231 also detects the enlargement errors due to atmospheric pressure variations, the enlargement signal $\Delta M_1$ can also be used to correct for pressure variations by means of the servo control system 233. A zero point adjustment or a so-called "offset" as used in the focus detector 229 is therefore not necessary with pressure variations for the enlargement detector 231. This means that the enlargement correction desired because of pressure variations is directly discounted in the enlargement error signal $\Delta M_1$ so that the latter need not necessarily be derived from tables or graphs based on measurements and calculations. The risk of making errors during the enlargement correction is thus considerably reduced due to the fact that reading errors and interpolation errors are avoided.

The servo control system 233 shown in FIG. 7 comprises a first control loop 301 for adjusting the focusing and a second control loop 303 for adjusting the enlargement. As appears from FIG. 3, a sleeve 305 passed with clearance through the mask holder 23 and secured to the lens holder 21 projects beyond the contour of the mask holder 23 and a relative displacement of the holders 21 and 23 parallel to the Z-axis is converted into a translatory movement of a feeler 307, which is slidably journalled in a block 309 connected to the mask holder 23. The sleeve 305, the feeler 307 and the block 309 together constitute a relative position sensor, which is designated by reference numeral 311 in FIG. 7. The first control loop 301 can be activated from a control circuit 313 by a switch 315. The control loop 301 further includes a proportional integrating controller 317, the focus motor 183 and the focus detector 229 supplying the focus error signal $\Delta F$. The second control loop 303 can be activated from the control circuit 313 by a switch 319. The control loop 303 includes further a proportional integrating controller 321, the enlargement motor 197 and, depending upon the position of the switch 323, the enlargement detector 231 or the position sensor 311. The translatory movement of the feeler 307 in the position sensor 311 is converted by a sliding potentiometer 325 into an electrical signal which is supplied to a comparator 327. The enlargement error signal $\Delta M_1$ can be supplied by the switch 323 and a switch 329 to the comparator 327. A Volt meter 331 is connected to the output of the comparator 327 and to the control circuit 313. The switches 323 and 329 are coupled to each other and polarized in opposite senses. It will be explained hereinafter how the servo control system 233 is used and may be used, respectively, in preparation for and during a repeating exposure process in an opto-lithographic device.

For the manufacture of integrated circuits, such as, for example, semiconductor circuits, optical circuits and opto-electronic circuits in opto-lithographic devices, generally in the first instance a mechanical prealignment of the relevant substrate (31) is carried out, which was supplied, for example, automatically by means of a belt transport from a cassette containing several substrates to a so-called X, Y, $\phi$ table disposed in the opto-lithographic device. A flat side of the substrate is utilized for alignment with respect to a reference by means of translation and/or rotation of the substrate. The correct prealignment is controlled by means of a microscope. Subsequently, the substrate is transferred by means of a changer to the table 33 already described and is then set by tilting about axes parallel to the X- and Y-axes and a translation parallel to the Z-axis to a position lying within the range of a fine focusing adjustment. The said tilting and translatory movements with the table 33 are obtained by known (and therefore not shown) submechanisms in the table 33 and reference mechanisms mounted in the glass plate 11. The opto-lithographic device includes a fine alignment system 333 (FIG. 2) of a kind known in principle and described in U.S. Pat. No. 4,251,160. A helium neon laser 335 shown in FIG. 2, a polarization-sensitive splitting cube 337, prisms 339, 341, a so-called $\frac{1}{4}\lambda$ plate 343, a radiation detector 345, a light source 347 and an optical system 349 for adaptation of the optical path length form part of the alignment system 333. Further, the mask 29 and the substrate 31 are each provided with a pair of fine alignment rasters, by which the mask and the substrate are optically aligned with respect to each other during the alignment. After the optical fine alignment of the mask with respect to the substrate has been accomplished, the switch 315 is closed by means of the control circuit 313 (cf. FIG. 7) so that the first control loop 301 is activated and the focus error signal $\Delta F$ of the focus detector 229 is supplied by the PI controller 317 to the focus motor 183, which adjusts the desired distance between the lens system 13 and the substrate 31. During the focusing movement, the holders 21 and 23 perform together a synchronous translatory movement, the distance between the mask 29 and the lens system (object distance) being kept constant. In the opto-lithographic device described above, the object distance may essentially be kept constant in a number of ways during focusing. Due to the small eccentricity (15 μm) of the eccentric 199, the extent of self-braking of the second actuator is comparatively great. Under normal conditions, a relative displacement between the holders during focusing need therefore not be feared. However, if it is expected that, for example, vibrations can lead to a relative displacement of the holders, the switch 319 can be closed and the second control loop can be activated by means of the control circuit 313. The operation of the second control loop will be described more fully hereinafter. When the enlargement motor is energized with a comparatively small hold current, an electromechanical braking can be added to the mechanical self-braking of the eccentric 199. As already described with reference to FIG. 5, the zero point adjustment of the focus detector 229 can be varied by rotation of the planeparallel plate 259. This may be effected semi-automatically by a servo drive or by hand. If if appears that, for example, the atmosphere pressure makes a variation of the zero point adjustment necessary, an offset of the focus detector is realized already during this fine focusing. Also if there should be focused at a level in the substrate 31 below the top surface in the substrate 31, the offset may be used. The offset for the atmosphere pressure can be determined from graphs or tables. The latter can be stored in an electronic memory which is coupled to a meter for the atmospheric pressure. Each pressure then automatically produces an offset which is supplied to the servo drive of the plane parallel plate 259. As the case may be, a threshold may be used at which a correction is carried out only when the threshold has exceeded. After the correct distance (image distance) between the lens system 13 and the substrate 31 has been adjusted, with a closed switch 315 and consequently with an activated first control loop (301) the switch 319 is closed and the second control loop 303 is activated for the adjustment of the correct enlargement. As already described with reference to FIG. 6, the drive 293 (linear motor 37, 39) of the table 33 is used during the adjustment of the enlargement to obtain the enlargement error signal $\Delta M_1$. This is effected by means of a uniform reciprocating movement of the table 33 parallel to their X-axis by a converter not shown further in FIG. 7. Since the first control loop 301 is then activated, an optimum focusing during the enlargement is constantly ensured. Any thickness variations of the substrate 31 thus cannot influence the accuracy of the focusing already obtained in an unacceptable manner during the adjustment of the enlargement. The enlargement detector 231 supplies by the closed switches 323 and 329 the enlargement error signal (second control signal) to the PI controller 321, of which the output signal controls the enlargement motor 197 for adjusting the enlargement. During the adjustment of the enlargement, the mechanical selfbraking due to the small eccentricity (15 μm) of the eccentric sleeve 187 is sufficiently large under normal conditions so that a simultaneous displacement of the holders 21 and 23 parallel to the Z-axis can be prevented. If, for example, vibrations are expected, an additional electromechanical braking can be obtained by energizing the focus motor 183 during the adjustment of the enlargement with a small hold current. This can be effected by means of the offset of the focus detector 229. The switch 323 actuated by the control circuit 313 is coupled to the switch 329. This means that the enlargement error signal $\Delta M_1$ is also supplied to the comparator 327. At the instant at which the enlargement adjustment by the enlargement detector 231 is terminated by stopping the table 33, the difference signal of the optically measured enlargement error signal and the signal supplied by the position sensor 311 and converted by the potentiometer 325 is measured by means of the meter 331. The potentiometer 325 is now adjusted so that the signal measured by the Volt meter 331 is equal to zero. In this manner, the position sensor 311 is calibrated by means of the optical enlargement signal $\Delta M_1$ and a third control signal is obtained which replaces the second control signal during the series of exposures then to be carried out on the substrate. Since the drive 293 (linear motor 37, 39) is substantially constantly in operation at the exposure stage to displace the substrate 31 from one exposure position to the other, the optical enlargement detector 231 can be utilized in principle only during given intervals in the series of exposures. Therefore, it is to be preferred to use during the series of exposures of one substrate only the position sensor 311 calibrated already by the enlargement detector. The switches 323 and 329 are then in the position shown in dotted lines in FIG. 7. In FIG. 7, an additional signal is further indicated which can be supplied to the comparator 327 for, for example, a correction because of atmospheric pressure variations. This may be effected in the same manner (automatically or manually) as already described in connection with the focus error signal $\Delta F$. The ultimately obtained enlargement error signal $\Delta M_2$ is the signal used during the series of exposures for correcting the enlargement which may vary due to temperature, pressure and mechanical vibrations. It should be noted that both the focus detector 229 and the enlargement detector 231 supply a signal $\Delta F$ and $\Delta M_1$, respectively, in which the influence of the atmospheric pressure is in principle not discounted. The influence thereof is nevertheless discounted in the control loops 301 and 303 in both cases by a zero point adjustment or offset. These control loops remain activated also during the exposure stage so that the focusing and enlargement can always be adjusted to the optimum. The servo control described can be carried out both in a digital and in an analogue form and is not limited to the detectors described with reference to FIGS. 6 and 7. The method according to the invention can be used in opto-lithographic devices, in which the lens system is arranged separately. In this case, a substrate table and a mask table are present, which can be displaced with respect to the lens system parallel to the Z-axis.

The elastic coupling members in the form of rings described above may be replaced by known cuts in the holders 21 and 23, although the rings having a more closed construction are to be preferred. The rings as such may be provided with cams, thickened and thinned parts, which render the use of spacer plates superfluous. By means of an adjustment bolt in the threaded hole 171 (cf. FIG. 3), the holders 21 and 23 may be tilted in such a manner that an optimum additional prefocusing is obtained. In this case, a number of test images are produced in order to find the optimum focusing, after which the holders 21, 23 are clamped with the ring 161.

Although in the embodiments of the opto-lithographic device described above, the lens holder 21 is situated at least in part within the mask holder 23, this is not necessary. The mask holder 23 may also be situated entirely or in part within the lens holder 21, in which event the lens holder may reach into the mask holder.

What is claimed is:

1. An opto-lithographic device comprising a lens system which is arranged between a mask support and a substrate table and which is telecentric on the side of the substrate, in which device the distance between the lens system and the substrate table is adjustable by means of an actuator cooperating with a circular-cylindrical holder which is coupled to the lens system and is suspended in a fixedly arranged frame by elastically deformable coupling members, the extent of deformation of said coupling members being determined by the force exerted on the holder by means of the actuator, wherein the device comprises a first and a second circular-cylindrical coaxial holder, said second circular-cylindrical coaxial holder being displaceable with respect to and together with the first circular-cylindrical holder and a fixedly arranged first actuator cooperating with one of the holders and a second actuator secured to one of the holders and cooperating with the other holder, a first elastic coupling member securing one holder to the other holder and a second elastic coupling member securing one of the holders to the frame, said lens system being secured to one of said holders and said mask support being secured to the other holder and wherein the distance between the lens system and the substrate table is adjustable with a constant distance between the mask support and the lens system by means of the first actuator by elastic deformation of the second elastic coupling member and wherein the distance between the lens system and the mask support is adjustable with a constant distance between the substrate table and the lens system by means of the second actuator by elastic deformation of the first coupling member.

2. An opto-lithographic device as claimed in claim 1, wherein the lens ysystem is coupled to the first holder, which is surrounded at least in part by the second holder and is secured by means of a third elastic coupling member to the frame, while the second holder is secured by means of a fourth elastic coupling member to the first holder.

3. An opto-lithographic device as claimed in claim 2, characterized in that the elastic coupling members are constituted by elastically deformable metal rings provided with an even number of pairs of elastic pivots, between which are situated comparatively long sections of the ring, while comparatively short sections of the ring are situated between the elastic pivots of a pair, whereby the comparatively short sections of the first coupling member are secured alternately to the first holder and the second holder and the comparatively short sections of the second coupling member are secured alternately to the frame and to one of the holders.

4. An opto-lithographic device as claimed in claim 1, wherein at least one pre-stressed first compensation spring is arranged between the holders, while at least one pre-stressed second compensation spring is arranged between the frame and one of the holders.

5. An opto-lithographic device as claimed in claim 1, wherein the first and the second actuator are constituted by a first and a second eccentric, which are in engagement with one and the other holder, respectively, and are driven by a first and a second direct current motor, the first motor being secured to the frame, while the second motor is secured to one of the holders.

6. An opto-lithographic device as claimed in claim 1, wherein the device is provided with servo control means comprising a first and a second control loop, while in the first control loop an optical focusing detector secured to the holder with the lens system supplies a first control signal to a focusing motor coupled to the first actuator and in the second control loop an optical enlargement detector supplies a second control signal to an enlargement motor coupled to the second actuator.

7. An opto-lithographic device as claimed in claim 1 wherein the elastic coupling members are constituted by elastically deformable metal rings provided with an even number of pairs of elastic pivots, between which are situated comparatively long sections of the ring, while comparatively short sections of the ring are situated between the elastic pivots of a pair, whereby the comparatively short sections of the first coupling member are secured alternately to the first holder and the second holder and the comparatively short sections of the second coupling member are secured alternately to the frame and to one of the holders.

* * * * *